US011587865B2

(12) United States Patent
Yang

(10) Patent No.: US 11,587,865 B2
(45) Date of Patent: Feb. 21, 2023

(54) SEMICONDUCTOR DEVICE INCLUDING CAPACITOR AND RESISTOR

(71) Applicant: Taiwan Semiconductor Manufacturing Company Limited, Hsinchu (TW)

(72) Inventor: Chi-Han Yang, Hsinchu (TW)

(73) Assignee: SEMICONDUCTOR DEVICE INCLUDING CAPACITOR AND RESISTOR, Hsinchu (TW)

( * ) Notice: Subject to any disclaimer, the term of this patent is extended or adjusted under 35 U.S.C. 154(b) by 0 days.

(21) Appl. No.: 16/901,666

(22) Filed: Jun. 15, 2020

(65) Prior Publication Data

US 2021/0391253 A1 Dec. 16, 2021

(51) Int. Cl.
*H01L 23/522* (2006.01)
*H01L 21/70* (2006.01)
*H01L 27/01* (2006.01)
*H01L 49/02* (2006.01)
*H01L 21/768* (2006.01)

(52) U.S. Cl.
CPC ........ *H01L 23/5226* (2013.01); *H01L 21/707* (2013.01); *H01L 21/76885* (2013.01); *H01L 27/01* (2013.01); *H01L 28/20* (2013.01); *H01L 28/40* (2013.01)

(58) Field of Classification Search
CPC ..... H01L 23/5226; H01L 27/01; H01L 28/20; H01L 28/40; H01L 28/60; H01L 21/707; H01L 21/76885; H01L 27/0207; H01L 27/2418; H01L 2224/1207; H01L 49/02
See application file for complete search history.

(56) References Cited

U.S. PATENT DOCUMENTS

| 4,454,495 | A | * | 6/1984 | Werner | ................. | H01C 7/008 338/195 |
| 7,102,367 | B2 | | 9/2006 | Yamagishi et al. | | |
| 2003/0017699 | A1 | * | 1/2003 | Zurcher | ................. | H01L 28/55 438/687 |
| 2005/0079734 | A1 | * | 4/2005 | Park | ................. | H01L 21/76829 438/783 |
| 2011/0207328 | A1 | | 8/2011 | Speakman | | |
| 2013/0341759 | A1 | * | 12/2013 | Khan | ..................... | H01L 28/24 257/533 |
| 2015/0108607 | A1 | * | 4/2015 | Chen | ..................... | H01L 28/24 257/533 |
| 2015/0357400 | A1 | * | 12/2015 | Furuhashi | ......... | H01L 23/53219 257/533 |
| 2019/0123130 | A1 | * | 4/2019 | Wang | ................. | H01L 23/5228 |
| 2019/0148370 | A1 | | 5/2019 | Hung et al. | | |

FOREIGN PATENT DOCUMENTS

WO  WO-2008/047144 A1  4/2008

* cited by examiner

*Primary Examiner* — Galina G Yushina

(74) *Attorney, Agent, or Firm* — Foley & Lardner LLP

(57) ABSTRACT

A semiconductor device includes a capacitor and a resistor. The capacitor includes a first plate, a capacitor dielectric layer disposed over the first plate, and a second plate disposed over the capacitor dielectric layer. The resistor includes a thin film. The thin film of the resistor and the first plate of the capacitor, formed of a same conductive material, are defined in a single patterning process.

20 Claims, 15 Drawing Sheets

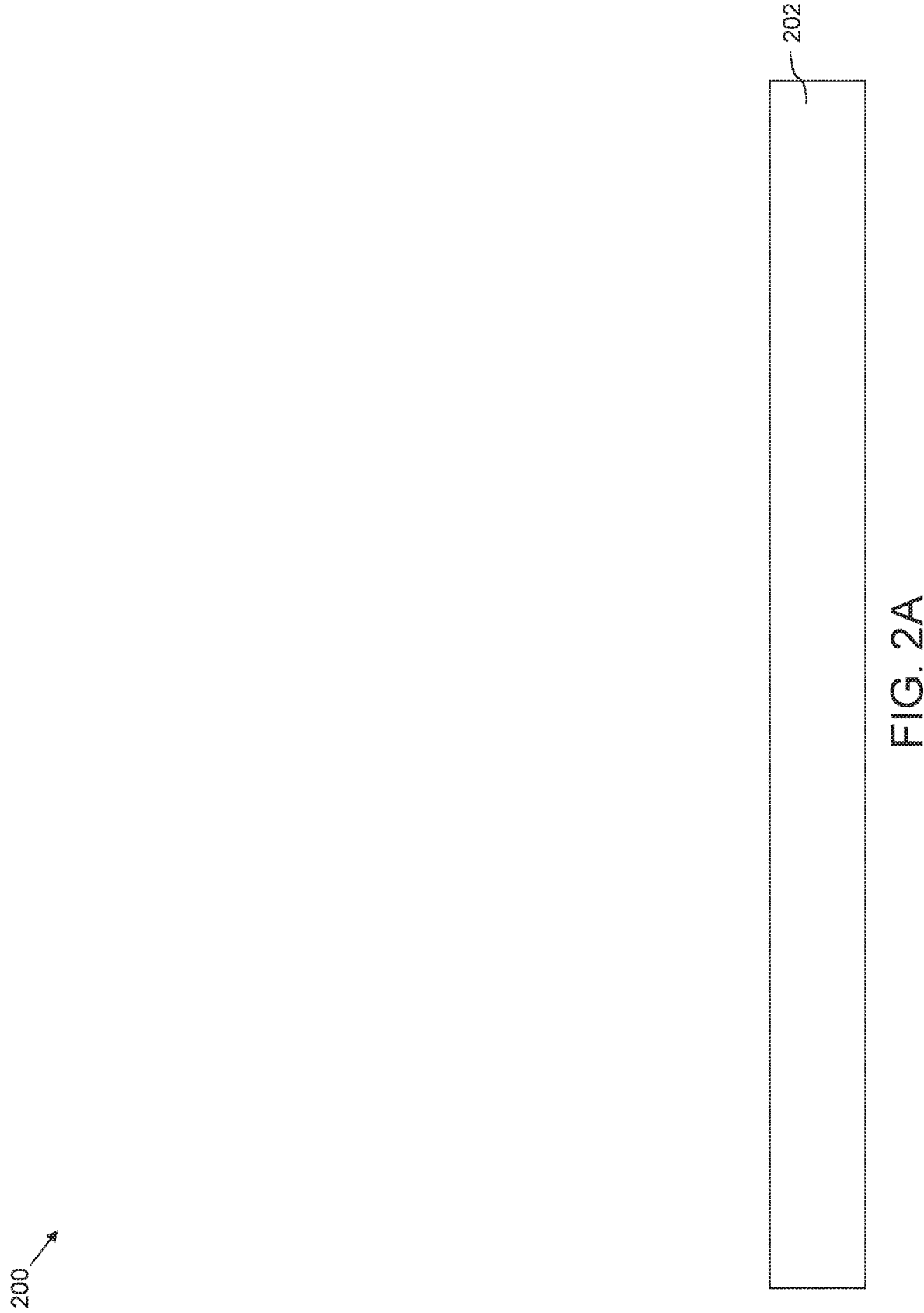

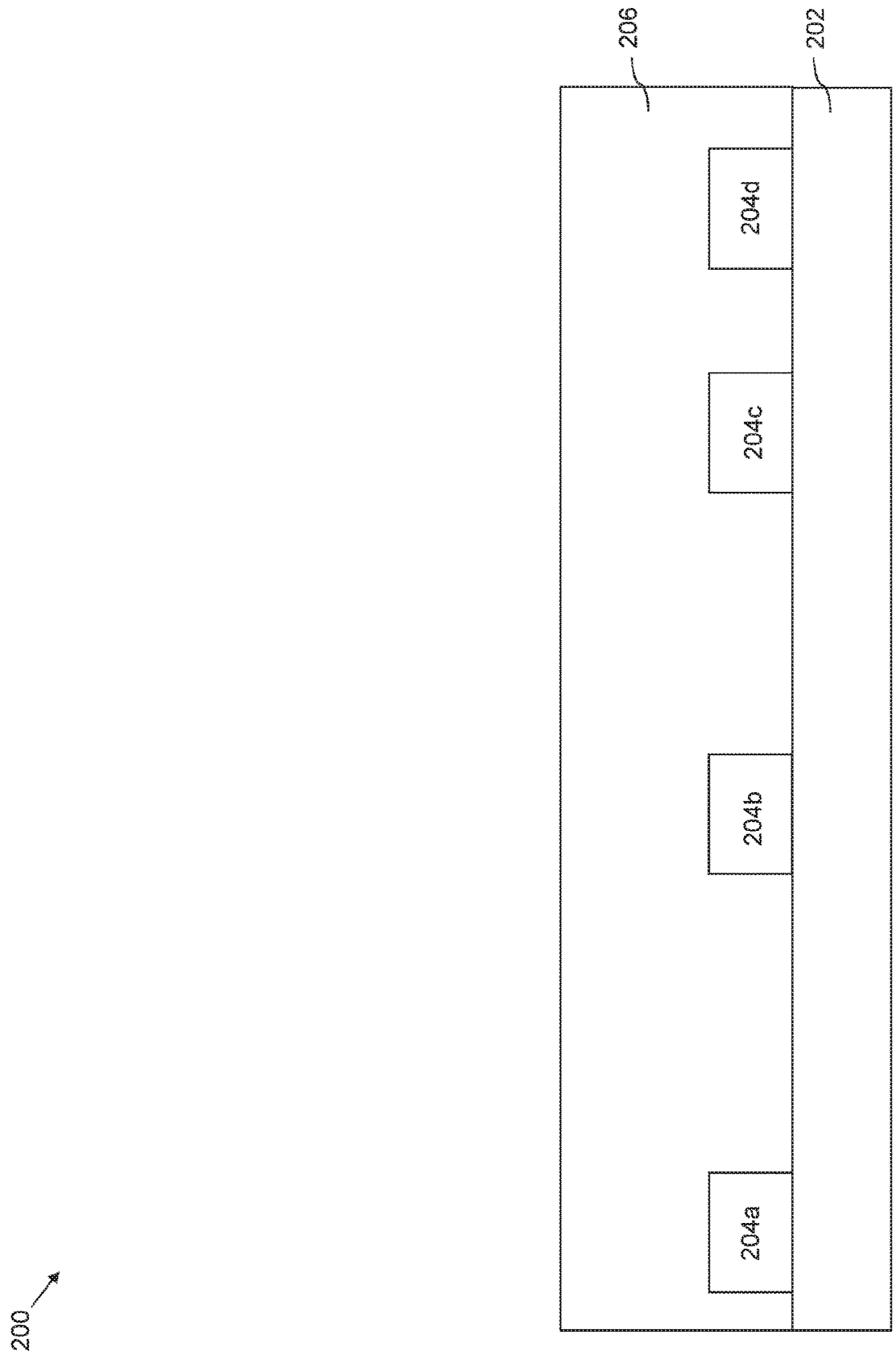

SEMICONDUCTOR DEVICE INCLUDING CAPACITOR AND RESISTOR

BACKGROUND

Capacitors and resistors are standard components in many semiconductor integrated circuits. For example, the capacitor can be used in in various radio frequency (RF) circuits (e.g., an oscillator, phase-shift network, filter, converter, etc.), in dynamic random-access memory (DRAM) cells, and as a decoupling capacitor in high power microprocessor units (MPUs); and the resistor is typically used together with the capacitor to control respective resistances of other electronic components of at least one the above-mentioned circuits.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIGS. 2A, 2B, 2C, 2D, 2E, 2F, 2G, 2H, 2I, 2J, 2K, 2L, and 2M illustrate cross-sectional views of an exemplary semiconductor device during various fabrication stages, made by the method of FIGS. 1A and 1B, in accordance with some embodiments.

DETAILED DESCRIPTION OF EXEMPLARY EMBODIMENTS

Figure 1A:
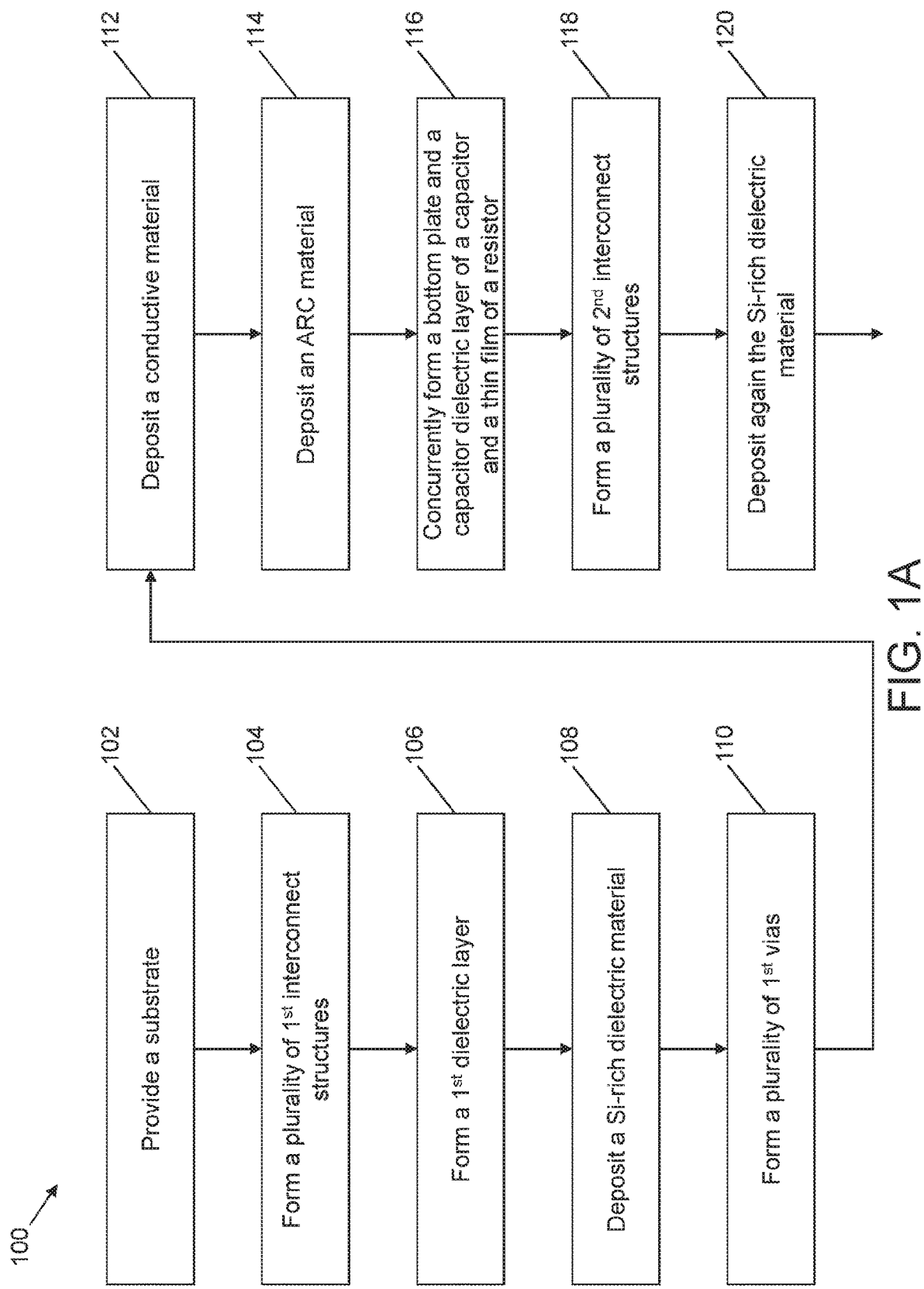
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a capacitor is implemented by a metal-insulator-metal (MIM) structure (hereinafter "MIM capacitor"), which includes two metal plates and an insulator sandwiched therebetween serving as a capacitor dielectric layer. A resistor is implemented by a metal thin film resistor. The metal thin film may be characterized as having a low temperature coefficient of resistivity (TCR) (hereinafter "low TCR metal resistor"). Various reasons are present to implement the capacitor and resistor as the MIM capacitor and low TCR metal resistor, respectively, over other capacitor and resistor structures (or materials). For example, compared to a MOS (metal-oxide-semiconductor) capacitor consisting of one semiconductor electrode and a metal plate, under a same area, a MIM capacitor can provide a larger capacitance (which is typically desirable in various circuits) than that of a MOS capacitor. And, although other thin film resistors that are not made of metal (e.g., polysilicon) may also present a low TCR, when compared to the metal thin film resistor, such a non-metal thin film resistor typically presents a tighter (i.e., narrower) sheet resistance tolerance, which disadvantageously limits its usage.

Conventionally, when making the MIM capacitor that is compatible with complementary metal-oxide-semiconductor (CMOS) technologies, two or more patterning processes (e.g., photolithography processes, which are sometimes referred to as "masks") are required. For example, a first mask is used to make (e.g., define) a metal thin film of the low TCR metal resistor, followed by a second mask to etch additional layers (e.g., an anti-reflective coating (ARC) layer and a landing pad layer) formed on the metal thin film. As such, the fabrication cost/resource/time may be increased. Therefore, conventional MIM capacitors and low TCR metal resistors, and methods to form such capacitors and resistors, are not entirely satisfactory.

The present disclosure provides various embodiments of a semiconductor device including at least one capacitor and at least one thin film resistor that can be fabricated by a single patterning process. In some embodiments, the capacitor may be a MIM (metal-insulator-metal) capacitor, and the thin film resistor may be a low TCR (temperature coefficient of resistivity) metal resistor. In some embodiments, one of the metal plates (e.g., a bottom metal plate) of the MIM capacitor and a metal thin film of the low TCR metal resistor are concurrently defined during the single patterning process. For example, the bottom metal plate of the MIM capacitor and the metal thin film of the low TCR metal resistor are formed by patterning (e.g., etching) a same metal material using respective different patterns contained in a same mask during the common patterning process. As such, the above-mentioned issues may be advantageously avoided while making a semiconductor device including an MIM capacitor and a low TCR metal resistor.

Figure 1B:
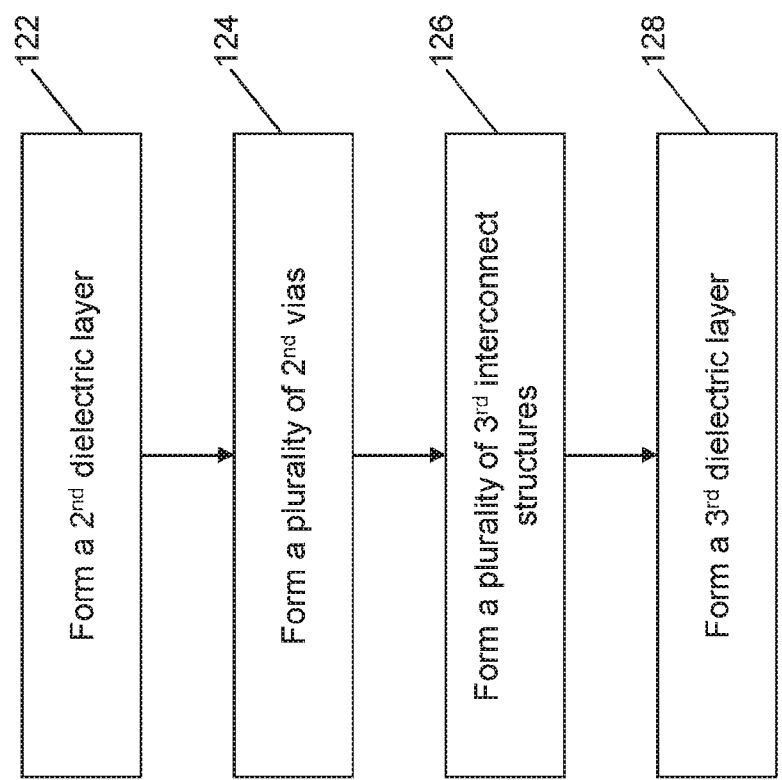

FIGS. 1A and 1B collectively illustrate a flowchart of a method 100 to form a semiconductor device, including at least one MIM capacitor and one low TCR metal resistor, according to one or more embodiments of the present disclosure. It is noted that the method 100 is merely an example, and is not intended to limit the present disclosure. Accordingly, it is understood that additional operations may be provided before, during, and after the method 100 of FIGS. 1A-B, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, 2H, 2I, 2J, 2K, 2L, and 2M, respectively, which will be discussed in further detail below.

In brief overview, the method 100 starts with operation 102 in which a substrate is provided. The method 100 continues to operation 104 in which a plurality of first interconnect structures are formed. The method 100 continues to operation 106 in which a first dielectric layer is formed. The method 100 continues to operation 108 in which a silicon (Si)-rich dielectric material is deposited. The method 100 continues to operation 110 in which a plurality of first vias are formed. The method 100 continues to operation 112 in which a conductive material is deposited. The method 100 continues to operation 114 in which an anti-reflective coating material is deposited. The method 100 continues to operation 116 in which the bottom plate and the capacitor dielectric layer of a capacitor and the thin film of a resistor are concurrently formed. The method 100 continues to operation 118 in which a plurality of second interconnect structures are formed. The method 100 continues to operation 120 in which the Si-rich dielectric material is again deposited. The method 100 continues to operation 122 in which a second dielectric layer is formed. The method 100 continues to operation 124 in which a plurality of second vias are formed. The method 100 continues to operation 126 in which a plurality of third interconnect structures are formed. The method 100 continues to operation 128 in which a third dielectric layer is formed.

As mentioned above, FIGS. 2A-M illustrate, in a cross-sectional view, a portion of a semiconductor device 200, including at least one capacitor and at least one resistor, at various fabrication stages of the method 100 of FIGS. 1A and 1B. The semiconductor device 200 may be included in a microprocessor, memory cell, and/or other integrated circuit (IC). Also, FIGS. 2A-M are simplified for a better understanding of the concepts of the present disclosure. Although the figures illustrate the semiconductor device 200, it is understood the IC may comprise a number of other devices such as inductors, fuses, transistors, coils, etc., which are not shown in FIGS. 2A-M, for purposes of clarity of illustration.

Corresponding to operation 102 of FIG. 1A, FIG. 2A is a cross-sectional view of the semiconductor device 200 including a substrate 202 at one of the various stages of fabrication. The substrate 202 may be an inter-layer dielectric (ILD) layer disposed at a bottom tier. Accordingly, disposed below or overlaid by the substrate 202, one or more device features (e.g., a gate, a drain, a source of a transistor) and/or conductive features (e.g., a conduction plug), which are not shown for purposes of clarity, may be present. In some embodiments, the layers disposed above the substrate 202 may be collectively referred to as back-end-of-line (BEOL) layers.

The substrate 202 includes a material that is at least one of the following materials: silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 2B:
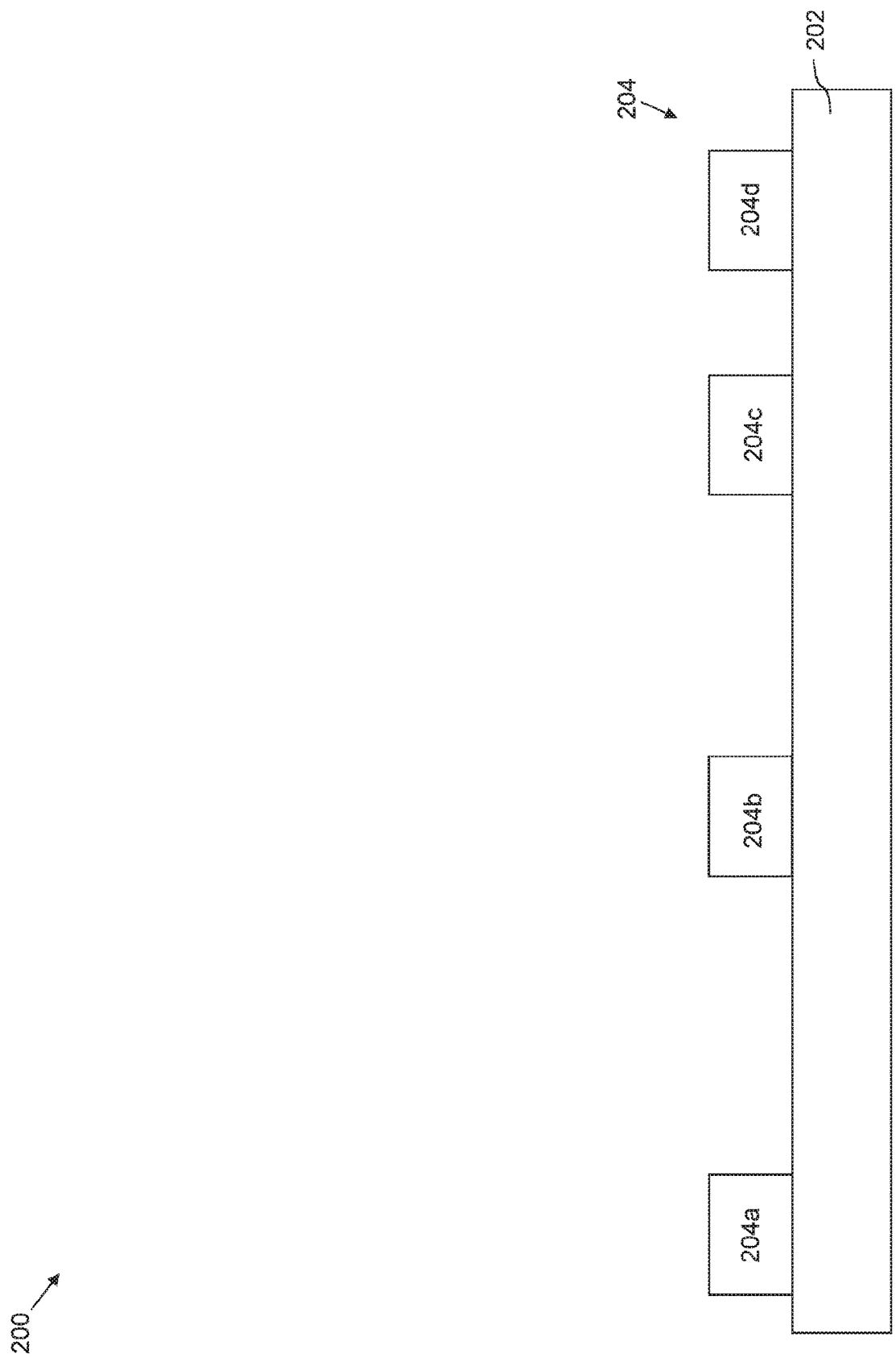

Corresponding to operation 104 of FIG. 1A, FIG. 2B is a cross-sectional view of the semiconductor device 200 including a plurality of first interconnect structures 204, at one of the various stages of fabrication. For example, the first interconnect structures 204 include first interconnect structures 204a, 204b, 204c, and 204d. Although in the illustrated embodiment of FIG. 2B (and the following figures), four of the first interconnect structures 204 are shown, it is appreciated that any number of the first interconnect structures 204 can be formed on the substrate 202 while remaining within the scope of the present disclosure. In some embodiments, the first interconnect structures 204a to 204d, formed on the substrate 202, may be laterally spaced apart from each other. In this way, after forming a dielectric material over the first interconnect structures 204a to 204d (which shall be discussed below), each of the first interconnect structures 204a to 204d may respectively function as the conductive contact or pad for a device component.

In the illustrated embodiment of FIG. 2B, the first interconnect structures 204a to 204d may be formed by performing at least one or more of the following processes: depositing a metal material (e.g., Cu, Al, or a combination thereof) over the substrate 202 using chemical vapor deposition (CVD), physical vapor deposition (PVD), electron-gun (E-gun), and/or other suitable techniques; forming, over the metal material, a mask layer (e.g., one or more photoresist layers, a hard mask layer, etc.) with a pattern that defines respective desired positions of the first interconnect structures 204a to 204d; etching, using the pattern, the metal material; removing the mask layer; and cleaning residues. In some other embodiments, the first interconnect structures 204a to 204d may be formed by performing at least one or more of the following processes: depositing a dielectric layer (e.g., at least a portion of an inter-metal dielectric (IMD) layer) over the substrate 202; forming, over the dielectric layer, a mask layer (e.g., one or more photoresist layers, a hard mask layer, etc.) with a pattern that defines respective desired positions of the first interconnect structures 204a to 204d; etching, using the pattern, the dielectric layer to form recesses (e.g., trenches) at least partially extending through the dielectric layer; depositing a metal material (e.g., Cu, Al, or a combination thereof) over the dielectric layer to fill the recesses; performing a polishing process (e.g., a chemical-mechanical polishing (CMP) process) on the deposited metal material to form the first interconnect structures 204a to 204d embedded in the dielectric layer; and cleaning residues. The formation of the embedded first interconnect structures 204a to 204d in the dielectric layer may sometimes be referred to as a damascene process.

Corresponding to operation 106 of FIG. 1A, FIG. 2C is a cross-sectional view of the semiconductor device 200 including a first dielectric layer 206, at one of the various stages of fabrication. The first dielectric layer 206, which may be an IMD layer, overlays the first interconnect structures 204a to 204d. In the example where the first interconnect structures 204a to 204d are formed as the bottommost interconnect structures of the BEOL layers, the first interconnect structures 204 may sometimes be referred to as metal 1s (M1s), and the first dielectric layer 206, including the M1s, may sometimes be referred to as an IMD1 layer. In the illustrated embodiment of FIG. 2C, the first interconnect structures 204a to 204d are formed prior to the formation of such an IMD1 layer. It is appreciated that the first interconnect structures 204a to 204d may be formed subsequently to the formation of the IMD1 layer, for example, by the above-described damascene process, while remaining within the scope of the present disclosure.

The first dielectric layer 206 includes a material that is at least one of the following materials: silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k or ultra-low-k dielectric materials. The first dielectric layer 206 may be formed using one of the following deposition techniques to deposit one or more of the above-listed dielectric materials over the first interconnect structures 204a to 204d: chemical vapor deposition (CVD), physical vapor deposition (PVD), atomic layer deposition (ALD), spin-on coating, and/or other suitable dielectric material deposition techniques.

Figure 2D:
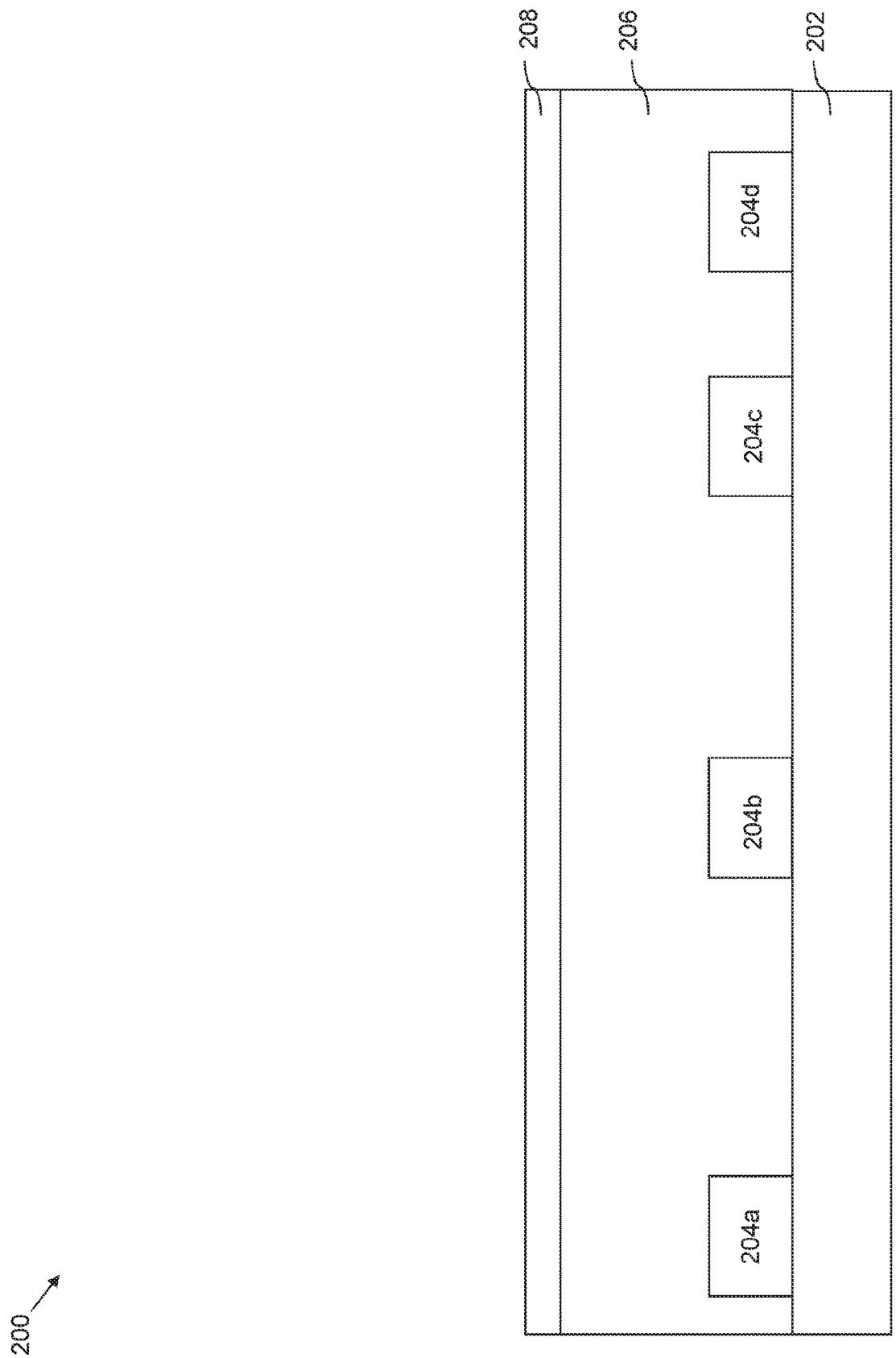

Corresponding to operation 108 of FIG. 1, FIG. 2D is a cross-sectional view of the semiconductor device 200 including a Si-rich dielectric material 208, at one of the various stages of fabrication. In some embodiments, the Si-rich dielectric material 208 may be a Si-rich oxide material. Forming such a Si-rich dielectric material 208 over the first dielectric layer 206 may help avoid undesired atoms from diffusing into device components to be formed above the Si-rich dielectric material 208. The Si-rich dielectric material 208 can include an oxide layer having numerous silicon nanocrystals therein. The Si-rich dielectric material 208 may be formed using a silane (SiH4) gas and a nitrous oxide (N2O) gas through a low pressure chemical vapor deposition (LPCVD) process, a plasma enhanced chemical vapor deposition (PECVD) process or a silicon implantation process.

Figure 2E:
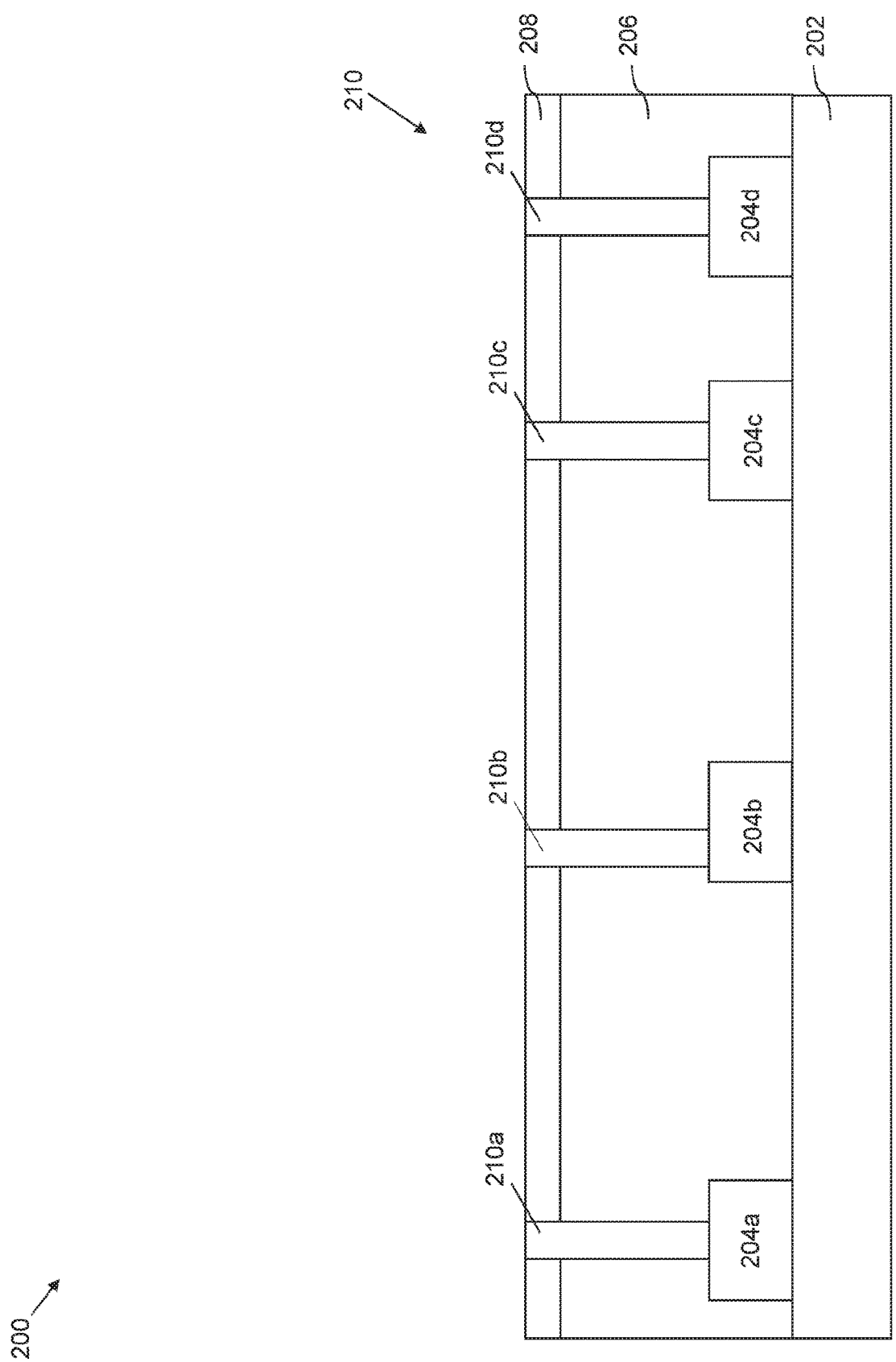

Corresponding to operation 110 of FIG. 1A, FIG. 2E is a cross-sectional view of the semiconductor device 200 including a plurality of first vias 210, at one of the various stages of fabrication. For example, the first vias include vias 210a, 210b, 210c, and 210d. The term "via" is generally referred to as a vertical interconnect structure that extends through one or more dielectric layers (e.g., an IMD layer) to electrically connect device components disposed along the top and bottom boundaries of the one or more dielectric layers. For example, the via 210a, extending through the first dielectric layer 206 and the Si-rich dielectric material 208, can electrically connect the first interconnect structure 204a to another device component (which shall be shown below); the via 210b, extending through the first dielectric layer 206 and the Si-rich dielectric material 208, can electrically connect the first interconnect structure 204b to another device component (which shall be shown below); the via 210c, extending through the first dielectric layer 206 and the Si-rich dielectric material 208, can electrically connect the first interconnect structure 204c to another device component (which shall be shown below); and the via 210d, extending through the first dielectric layer 206 and the Si-rich dielectric material 208, can electrically connect the first interconnect structure 204d to another device component (which shall be shown below).

The vias 210a to 210d may be formed by performing at least one or more of the following processes: forming, over the Si-rich dielectric material 208 (shown in FIG. 2D), a mask layer (e.g., one or more photoresist layers, a hard mask layer, etc.) with a pattern that defines respective desired positions of the vias 210a to 210d; etching, using the pattern, the Si-rich dielectric material 208 and the first dielectric layer 206 to form recesses (e.g., via holes) that expose respective top boundaries of the first interconnect structures 204a to 204d; depositing a metal material (e.g., Cu, Al, or a combination thereof) to fill the recesses; performing a polishing process (e.g., a chemical-mechanical polishing (CMP) process) on the deposited metal material to form the vias 210a to 210d extending through the Si-rich dielectric material 208 and the first dielectric layer 206; and cleaning residues.

Figure 2F:
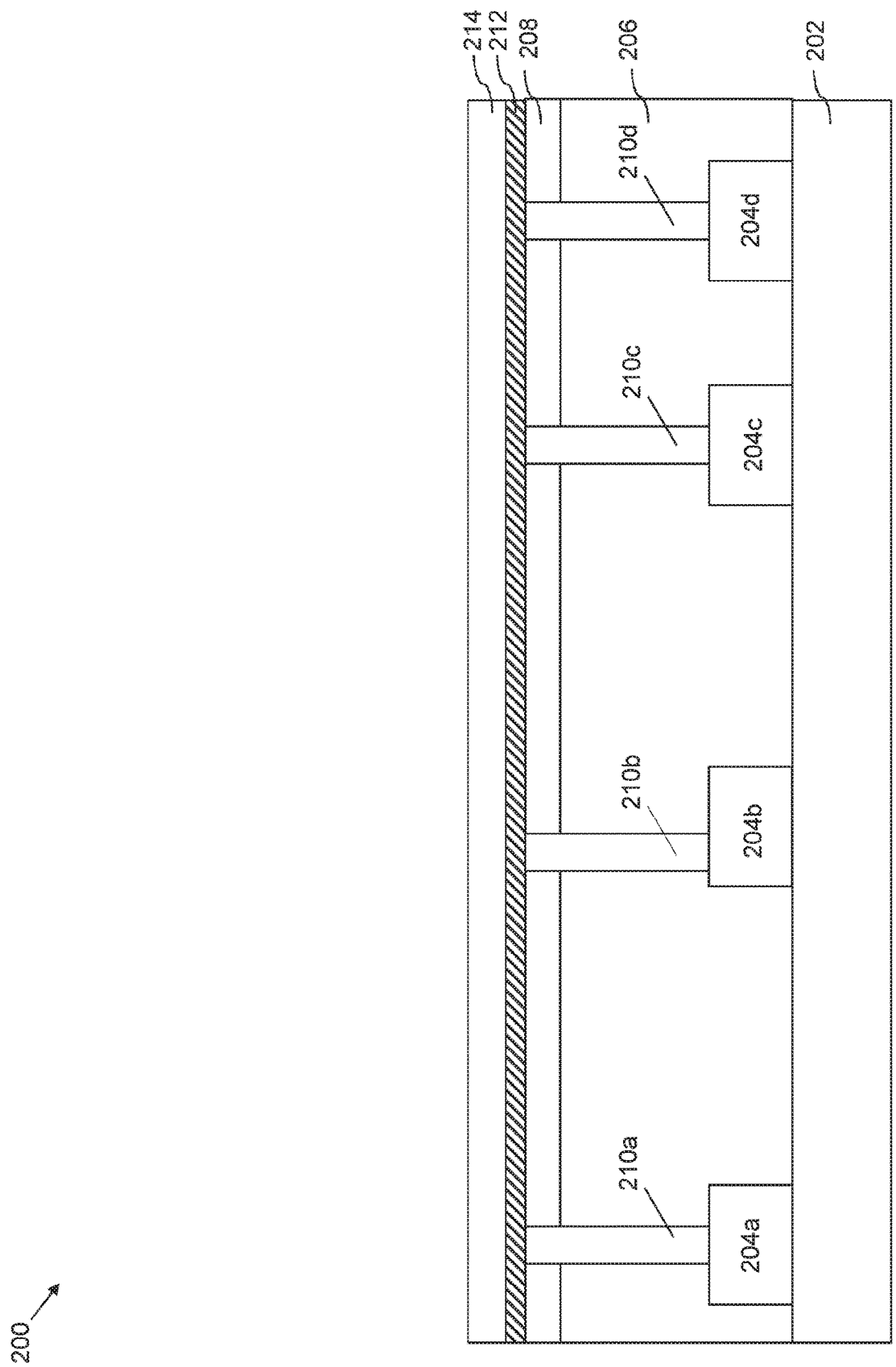

Corresponding to operations 112 and 114 of FIG. 1A, FIG. 2F is a cross-sectional view of the semiconductor device 200 including a conductive material 212 and an anti-reflective coating (ARC) material 214, at one of the various stages of fabrication. As shall be discussed below, the conductive material 212 may be used to define the thin film of a resistor (e.g., a low TCR metal resistor) and the bottom plate of a capacitor (an MIM capacitor). In some embodiments, the conductive material 212 is in direct contact with the vias 210a to 210d. Some of the vias can serve as the interconnect structures for the resistor. Since the vias are in direct contact with the resistor, the contact resistances for the resistor may be advantageously reduced, when compared to the existing resistors that typically includes a landing pad layer (e.g., a TiN layer) between the via and the resistor.

The conductive material 212 and the anti-reflective coating material 214 may be sequentially formed over the Si-rich dielectric material 208. In some embodiments, the conductive material 212 may include a metallic material selected from at least one of: Ta, TaN, Ti, TiN, W, WN, NiCr, or SiCr. The conductive material 212 may be formed by depositing one or more of the above-listed metallic materials over the Si-rich dielectric material 208 using chemical vapor deposition (CVD), physical vapor deposition (PVD), electron-gun (E-gun), and/or other suitable techniques. In some embodiments, the ARC material 214 may include a dielectric material selected from at least one of: $SiO_2$, $La_2O_3$, $ZrO_3$, Ba—Sr—Ti—O, or $Si_3N_4$. The ARC material 214 may be formed by depositing one or more of the above-listed dielectric materials over the conductive material 212 using chemical vapor deposition (CVD), physical vapor deposition (PVD), atomic layer deposition (ALD), spin-on coating, and/or other suitable dielectric material deposition techniques. In some embodiments, the conductive material 212 may have a thickness ranging from about 40 angstroms to about 50 angstroms, and the ARC material 214 may have a thickness ranging from about 40 angstroms to about 50 angstroms.

Figure 2G:
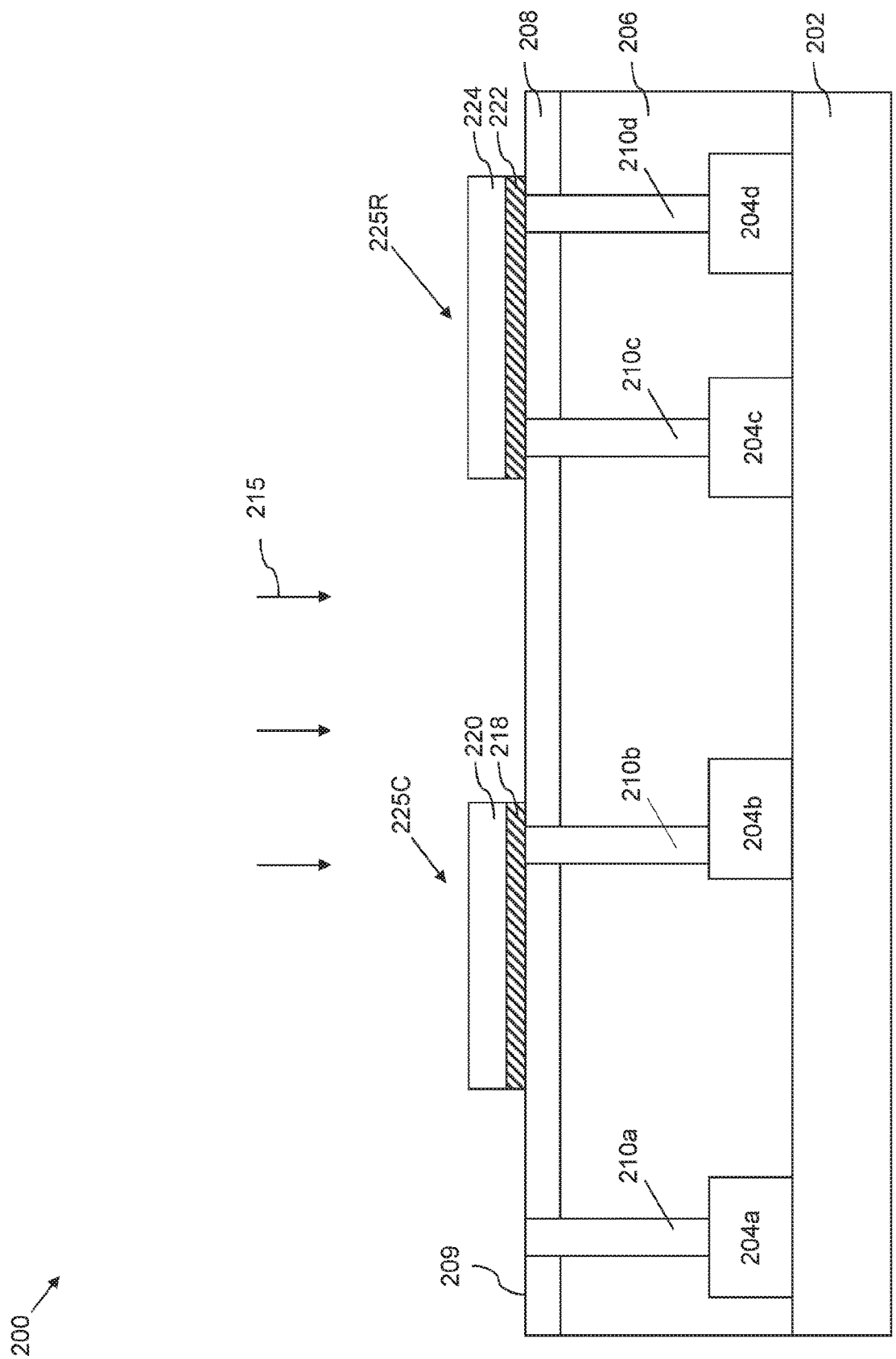

Corresponding to operation 116 of FIG. 1A, FIG. 2G is a cross-sectional view of the semiconductor device 200 including a first plate 218, a first dielectric segment 220, a thin film 222, and a second dielectric segment 224, at one of the various stages of fabrication. In some embodiments, the first plate 218, the first dielectric segment 220, the thin film 222, and the second dielectric segment 224 may be concurrently formed by performing a single patterning process 215 on the conductive material 212 and the ARC material 214, which shall be discussed below. As such, the first plate 218 and the thin film 222 may be coplanar with each other; and the first dielectric segment 220 and the second dielectric segment 224 may be coplanar with each other. The term "coplanar" is referred to as the respective top or bottom boundaries of two objects are aligned along a virtual or physical boundary. For example, the first plate 218 and the thin film 222 are coplanar with each other as the bottom boundaries of the first plate 218 and the thin film 222 are aligned along an intermediate boundary 209 of the Si-rich dielectric material 208.

The patterning process 215 may include at least one or more of the following processes: forming, over the ARC material 214 (shown in FIG. 2F), a mask layer (e.g., one or more photoresist layers, a hard mask layer, etc.) with a pattern that defines respective desired positions of the first plate 218 and the thin film 222; etching, using the pattern, the ARC material 214 and the conductive material 212 to concurrently form the first plate 218, the first dielectric segment 220, the thin film 222, and the second dielectric segment 224; and cleaning residues. In some other embodiments, the first dielectric segment 220 and the second dielectric segment 224 may be formed using the pattern by etching the ARC material 214 with a first etching rate. In response to forming the first dielectric segment 220 and the second dielectric segment 224 over the conductive material 212, the first plate 218 and the thin film 222 may be formed using the same pattern by etching the conductive material 212 with a second etching rate.

In some embodiments, upon forming the thin film 222, a low TCR metal resistor 225R may be formed with the second dielectric segment 224, as a resistor dielectric layer, formed over the low TCR metal resistor 225R. Further, concurrently with forming the first plate 218 and the first dielectric segment 220, a portion of an MIM capacitor 225C may be formed. For example, the first plate 218 can function as a bottom plate or bottom electrode of the MIM capacitor 225C, and the first dielectric segment 220 can function as the capacitor dielectric layer of the MIM capacitor 225C. Accordingly, the first plate 218, the first dielectric segment 220, and the second dielectric segment 224 are herein referred to as "bottom plate 218," "capacitor dielectric layer 220," and "resistor dielectric layer 224," respectively. In some embodiments, the bottom plate 218 and thin film 222 may inherit a substantially similar thickness as the thickness of the conductive material 212, which ranges from about 40 angstroms to about 50 angstroms; and the capacitor dielectric layer 220 and the resistor dielectric layer 224 may inherit a substantially similar thickness as the thickness of the ARC material 214, which ranges from about 100 angstroms to about 300 angstroms. In some embodiments, a ratio of the thickness of the bottom plate 218 and thin film 222 to the thickness of the capacitor dielectric layer 220 and resistor dielectric layer 224 may range from about 0.2 to 0.25, as it may be desired to keep the thickness of the thin film 222 of the low TCR metal resistor 225R, which also defines the thickness of the bottom plate 218 of the MIM capacitor 225C, substantially small. This is because when the thickness of the thin film 222 is too large, a resistance of the low TCR metal resistor 225R may become too small, which is generally undesired in the applications of a low TCR metal resistor.

Figure 2H:
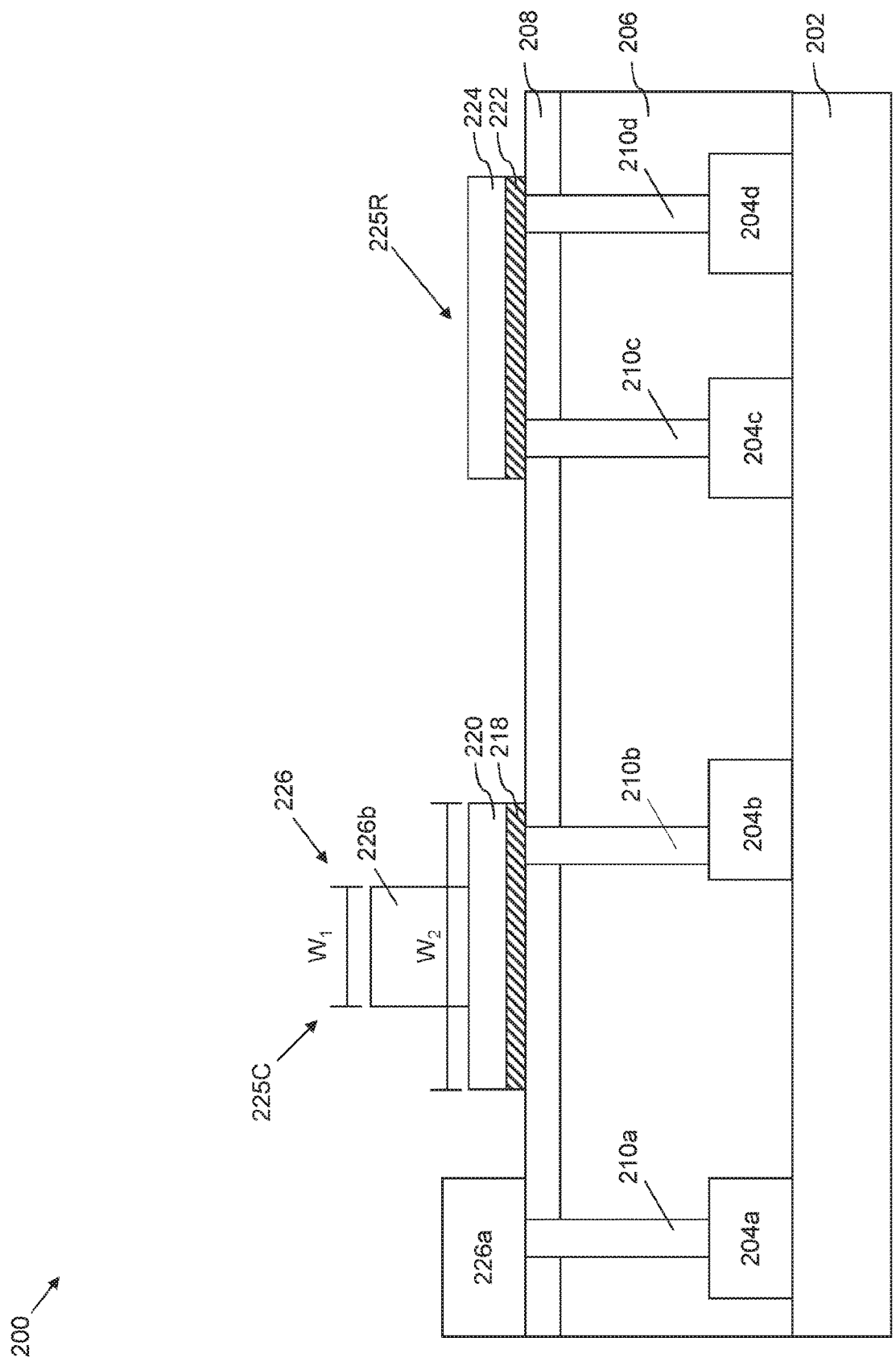

Corresponding to operation 118 of FIG. 1A, FIG. 2H is a cross-sectional view of the semiconductor device 200 including a plurality of second interconnection structures 226, at one of the various stages of fabrication. For example, the second interconnection structures include interconnection structures 226a and 226b. In some embodiments, at least one of the second interconnect structures 226 is formed over the capacitor dielectric layer 220 such as, for example, the second interconnect structure 226b. The second interconnect structure 226b may have a width ($W_1$) less than a width ($W_2$) of the bottom plate 218 and the capacitor dielectric layer 220. In some embodiments, a ratio of $W_2$ to $W_1$ may range from 1.2 to 1.8. This is because when forming the second interconnection structure 226b, it is desired to laterally offset the second interconnection structure 226b from the via 210b to assure smoothness of the bottom plate 218 and the capacitor dielectric layer 220, in some embodiments. Having the bottom plate 218 and the capacitor dielectric layer 220 wider than the second interconnect structure 226b may facilitate such a lateral offset between the second interconnection structure 226b and the via 210b.

In some other embodiments, the width $W_1$ of the second interconnect structure 226b may range from about 3 microns to about 6 microns, and the width $W_2$ of the bottom plate 218 and the capacitor dielectric layer 220 may range from about 800 microns to about 1200 microns. At least one of the second interconnect structures 226 is formed to electrically connect the via 210a such as, for example, the second interconnect structure 226a. Although in the illustrated embodiment of FIG. 2H (and the following figures), two of the second interconnect structures 226 are shown, it is appreciated that any number of the second interconnect structures 226 can be formed while remaining within the scope of the present disclosure. In some embodiments, the second interconnect structures 226a to 226b may be laterally spaced apart from each other. In this way, after forming a dielectric material over the second interconnect structures 226a to 226b (which shall be discussed below), each of the second interconnect structures 226a to 226b may respectively function as a conductive contact, plate, or pad for a device component.

In the illustrated embodiment of FIG. 2H, the second interconnect structures 226a to 226b may be formed by performing at least one or more of the following processes: depositing a metal material (e.g., Cu, Al, or a combination thereof) over the Si-rich dielectric material 208 using chemical vapor deposition (CVD), physical vapor deposition (PVD), electron-gun (E-gun), and/or other suitable techniques; forming, over the metal material, a mask layer (e.g., one or more photoresist layers, a hard mask layer, etc.) with a pattern that defines respective desired positions of the second interconnect structures 226a to 226b; etching, using the pattern, the metal material; removing the mask layer; and cleaning residues. In some other embodiments, the second interconnect structures 226a to 226b may be formed by the above-described damascene process.

In some embodiments, the second interconnect structure 226b may function as a top plate or top electrode of the MIM capacitor 225C, herein "top electrode 226b." As such, in response to forming the top electrode 226b, the formation of the MIM capacitor 225C may be completed.

Figure 2I:
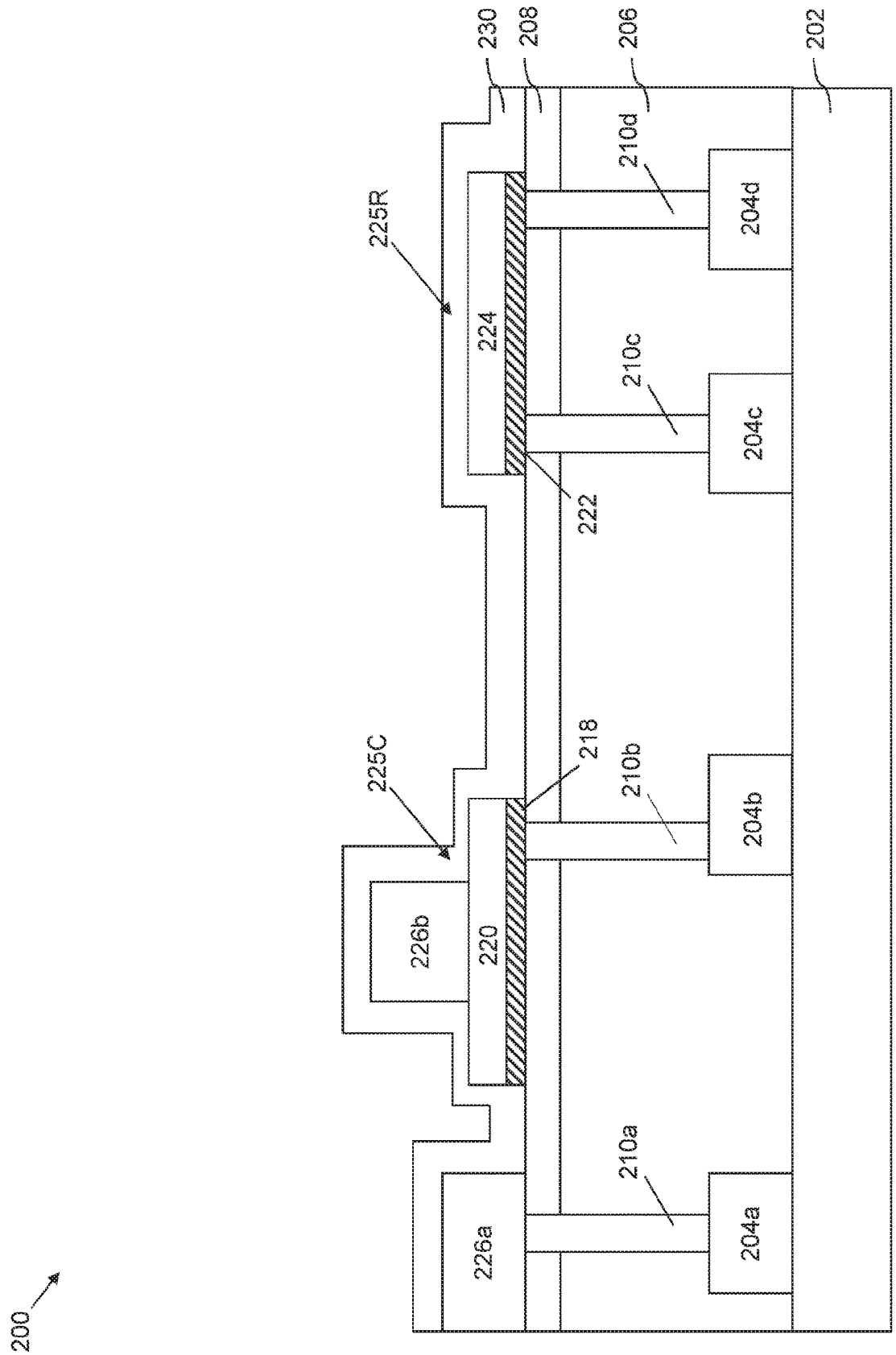

Corresponding to operation 120 of FIG. 1A, FIG. 2I is a cross-sectional view of the semiconductor device 200 including another Si-rich dielectric material 230, at one of the various stages of fabrication. In some embodiments, the Si-rich dielectric material 230 may be formed of a substantially similar dielectric material as the Si-rich dielectric material 208. As shown, the Si-rich dielectric material 230 may be formed to overlay the second interconnect structure 226a, the low TCR metal resistor 225R, and the MIM capacitor 225C. As such, upon forming the Si-rich dielectric material 230, the low TCR metal resistor 225R and the MIM capacitor 225C may be at least partially wrapped by a continuous Si-rich dielectric layer consisting of the Si-rich dielectric materials, 208 and 230.

Figure 2J:
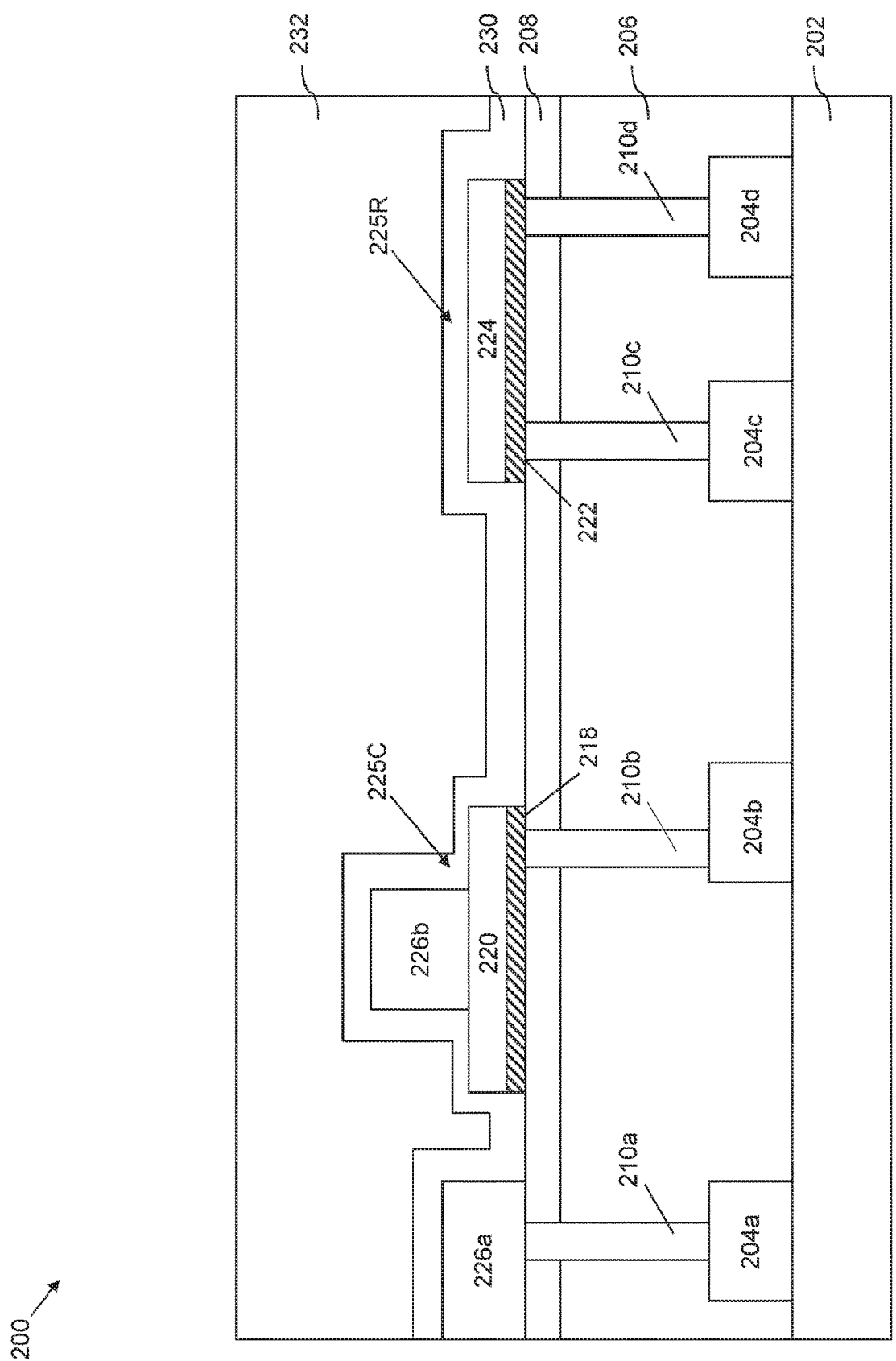

Corresponding to operation 122 of FIG. 1B, FIG. 2J is a cross-sectional view of the semiconductor device 200 including a second dielectric layer 232, at one of the various stages of fabrication. The second dielectric layer 232, which may be an IMD layer, overlays the Si-rich dielectric material 230. In the example where the first dielectric layer 206 is formed as the IMD1 layer, the second interconnect structures 226 may sometimes be referred to as metal 2s (M2s) and the second dielectric layer 232, including the M2s, may sometimes be referred to as an IMD2 layer. Although the low TCR metal resistor 225R and the MIM capacitor 225C are formed between the IMD1 layer (e.g., 206) and the IMD2 layer (e.g., 232), it is understood that the embodiments of the method disclosed herein can cause a low TCR metal resistor and an MIM capacitor to be formed between any subsequent IMD layers. In the illustrated embodiment of FIG. 2J, the second interconnect structures 204a to 204d are formed prior to the formation of such an IMD2 layer. It is appreciated that the second interconnect structures 226a to 226b may be formed subsequently to the formation of the IMD2 layer, for example, by the above-described damascene process, while remaining within the scope of the present disclosure.

The second dielectric layer 232 includes a material that is at least one of the following materials: silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k or ultra-low-k dielectric materials. The second dielectric layer 232 may be formed using one of the following deposition techniques to deposit one or more of the above-listed dielectric materials over the Si-rich dielectric material 230: chemical vapor deposition (CVD), physical vapor deposition (PVD), atomic layer deposition (ALD), spin-on coating, and/or other suitable dielectric material deposition techniques. In some embodiments, the second dielectric layer 232 may have a thickness that is about 10 times greater than the thickness of the conductive material 212 (the thin film 222). For example, the thickness of the second dielectric layer 232 may range from about 4000 angstroms to about 6000 angstroms. Each of the other dielectric layers (IMD layers) of the semiconductor device 200 may have a thickness substantially similar as the thickness of the second dielectric layer 232.

Figure 2K:
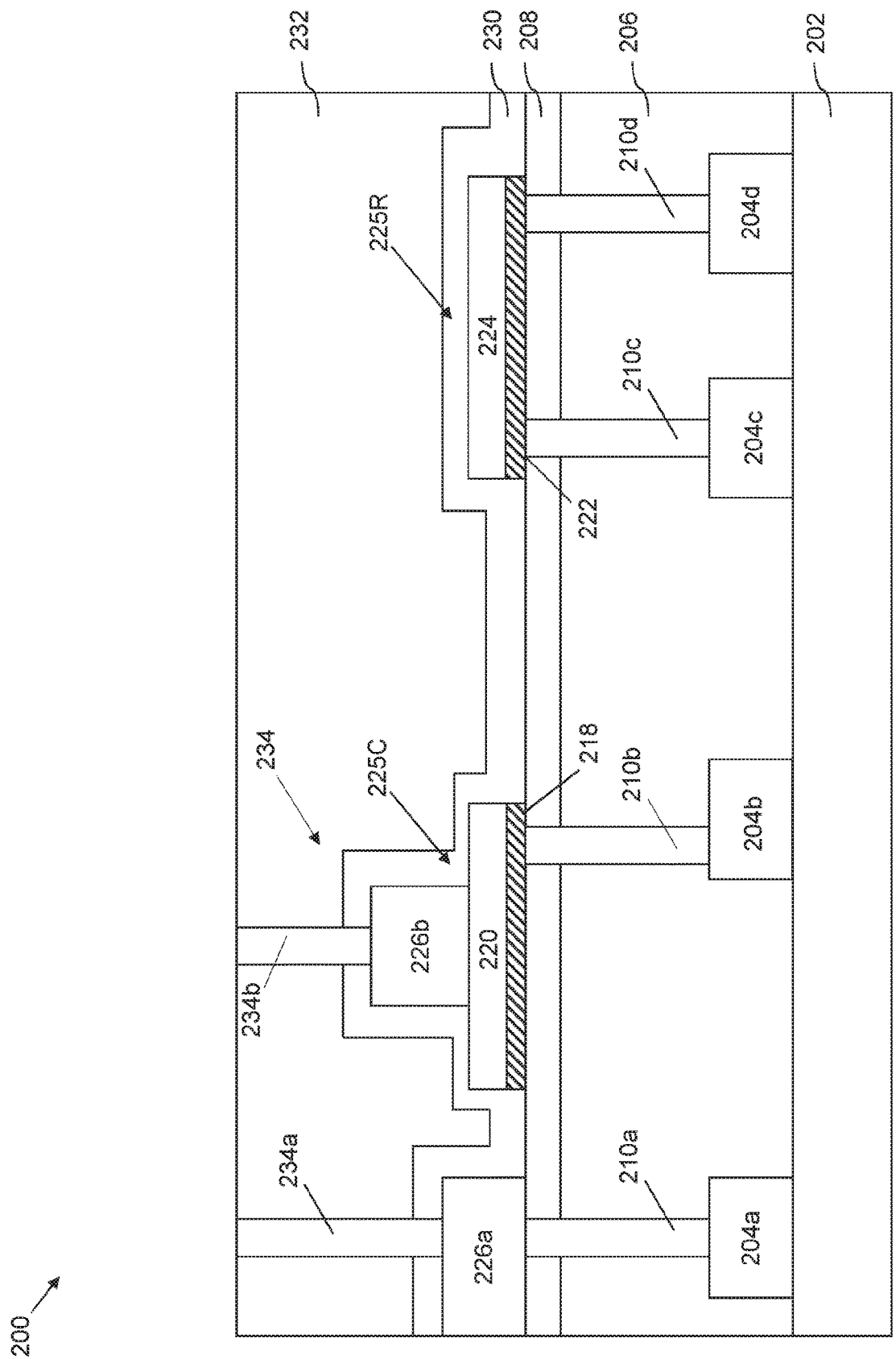

Corresponding to operation 124 of FIG. 1B, FIG. 2K is a cross-sectional view of the semiconductor device 200 including a plurality of second vias 234, at one of the various stages of fabrication. For example, the second vias include vias 234a and 234b. The via 234a, extending through the second dielectric layer 232 and the Si-rich dielectric material 230, can electrically connect the second interconnect structure 226a to another device component (which shall be shown below); and the via 234b, extending through the second dielectric layer 232 and the Si-rich dielectric material 230, can electrically connect the second interconnect structure (the top plate) 226b to another device component (which shall be shown below).

The vias 234a to 234b may be formed by performing at least one or more of the following processes: forming, over the second dielectric layer 232 (shown in FIG. 2J), a mask layer (e.g., one or more photoresist layers, a hard mask layer, etc.) with a pattern that defines respective desired positions of the vias 234a to 234b; etching, using the pattern, the second dielectric layer 232 and the Si-rich dielectric material 230 to form recesses (e.g., via holes) that expose respective top boundaries of the second interconnect structures 226a to 226b; depositing a metal material (e.g., Cu, Al, or a combination thereof) to fill the recesses; performing a polishing process (e.g., a chemical-mechanical polishing (CMP) process) on the deposited metal material to form the vias 234a to 234b extending through the Si-rich dielectric material 230 and the second dielectric layer 232; and cleaning residues.

Figure 2L:
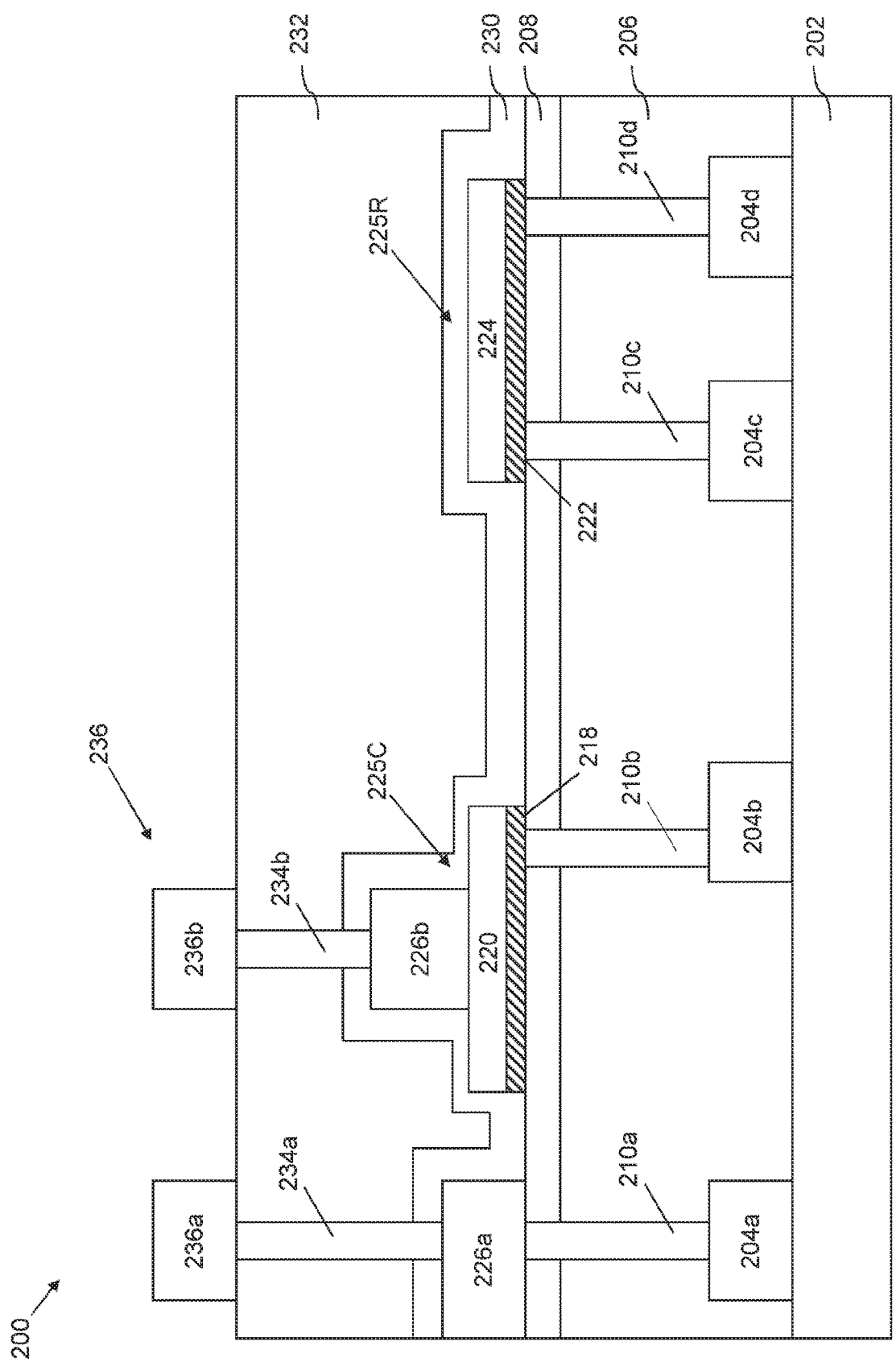

Corresponding to operation 126 of FIG. 1B, FIG. 2L is a cross-sectional view of the semiconductor device 200 including a plurality of third interconnect structures 236, at one of the various stages of fabrication. For example, the third interconnect structures include interconnect structures 236a and 236b. Although in the illustrated embodiment of FIG. 2L (and the following figures), two of the third interconnect structures 236 are shown, it is appreciated that any number of the third interconnect structures 236 can be formed on the second dielectric layer 232 while remaining within the scope of the present disclosure. In some embodiments, the third interconnect structures 236a to 236b, formed on the second dielectric layer 232, may be laterally spaced apart from each other. In this way, after forming a dielectric material over the third interconnect structures 236a to 236b (which shall be discussed below), each of the third interconnect structures 236a to 236b may respectively function as the conductive contact or pad for a device component.

In the illustrated embodiment of FIG. 2L, the third interconnect structures 236a to 236b may be formed by performing at least one or more of the following processes: depositing a metal material (e.g., Cu, Al, or a combination thereof) over the second dielectric layer 232 using chemical vapor deposition (CVD), physical vapor deposition (PVD), electron-gun (E-gun), and/or other suitable techniques; forming, over the metal material, a mask layer (e.g., one or more photoresist layers, a hard mask layer, etc.) with a pattern that defines respective desired positions of the third interconnect structures 236a to 236b; etching, using the pattern, the metal material; removing the mask layer; and cleaning residues. In some other embodiments, the third interconnect structures 236a to 236b may be formed by performing the above-described damascene process.

Figure 2M:
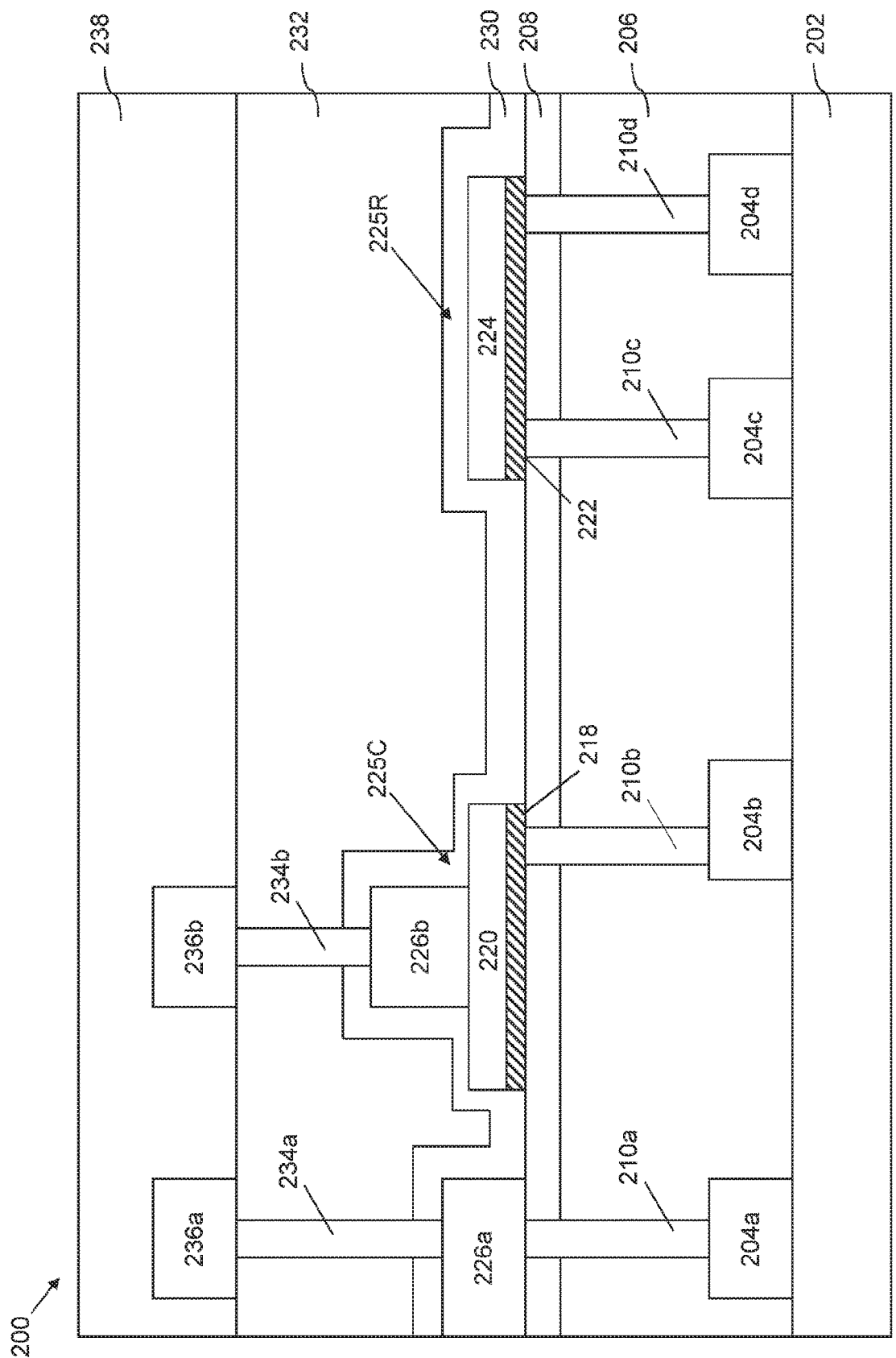

Corresponding to operation 128 of FIG. 1B, FIG. 2M is a cross-sectional view of the semiconductor device 200 including a third dielectric layer 238, at one of the various stages of fabrication. The third dielectric layer 238, which may be an IMD layer, overlays the third interconnect structures 236a to 236b. In the example where the second dielectric layer 232 is formed as the IMD2 layer, the third interconnect structures 236 may sometimes be referred to as metal 3s (M3s), and the third dielectric layer 238, including the M3s, may sometimes be referred to as an IMD3 layer. In the illustrated embodiment of FIG. 2M, the third interconnect structures 236a to 236b are formed prior to the formation of such an IMD3 layer. It is appreciated that the third interconnect structures 236a to 236b may be formed subsequently to the formation of the IMD3 layer, for example, by the above-described damascene process, while remaining within the scope of the present disclosure.

The third dielectric layer 238 includes a material that is at least one of the following materials: silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k or ultra-low-k dielectric materials. The third dielectric layer 238 may be formed using one of the following deposition techniques to deposit one or more of the above-listed dielectric materials over the third interconnect structures 236a to 236b: chemical vapor deposition (CVD), physical vapor deposition (PVD), atomic layer deposition (ALD), spin-on coating, and/or other suitable dielectric material deposition techniques.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a semiconductor device includes a capacitor and a resistor. The capacitor includes a first plate, a capacitor dielectric layer disposed over the first plate, and a second plate disposed over the capacitor dielectric layer. The resistor includes a thin film. The thin film of the resistor and the first plate of the capacitor includes the same conductive material. The thin film of the resistor and the first plate of the capacitor are defined in a single patterning process.

In another embodiment, a method for forming a semiconductor device includes forming a first dielectric layer over a plurality of interconnect structures. The method includes depositing a conductive material over the first dielectric layer. The method includes depositing a dielectric material over the first metal material. The method includes etching the conductive material and the dielectric material to concurrently define a thin film of a resistor, a bottom plate of a capacitor, and a capacitor dielectric layer of the capacitor. The method includes forming a top plate of the capacitor over the capacitor dielectric layer.

In yet another embodiment, a semiconductor device includes a first plate including a conductive material. The semiconductor device includes a thin film, also including the conductive material, that is substantially coplanar with the first plate. The semiconductor device includes a capacitor dielectric layer, including a dielectric material, that is disposed over the first plate. The semiconductor device includes a second plate, including the conductive material, that is disposed over the capacitor dielectric layer. The thin film constitutes at least a portion of a resistor and the first plate, the capacitor dielectric layer, and the second plate constitutes at least a portion of a capacitor.

What is claimed is:

1. A semiconductor device, comprising:
   a resistor disposed over a substrate and comprising a thin film overlaid by a resistor dielectric layer;
   a capacitor disposed over the substrate and comprising:
      a first plate;
      a capacitor dielectric layer disposed over the first plate; and
      a second plate disposed over the capacitor dielectric layer;
   a first Si-rich dielectric material having a plurality of silicon nanocrystals and disposed below the thin film and the first plate; and
   a second Si-rich dielectric material having a plurality of silicon nanocrystals and disposed over the thin film and the second plate;
   wherein the thin film of the resistor and the first plate of the capacitor comprise a same conductive material, and are defined in a single patterning process;
   wherein the first plate and capacitor dielectric layer have a first width, and the second plate has a second width, the first width being greater than the second width; and
   wherein the thin film and the first plate each have a first thickness, and the resistor dielectric layer and the capacitor dielectric layer each have a second thickness, a ratio of the first thickness to the second thickness being equal to or less than about 0.25.

2. The semiconductor device of claim 1, further comprising:
   a first vertical interconnect structure that extends at least partially through a first dielectric layer disposed below the first plate and the thin film, and which electrically connects the first plate to a first one of a plurality of interconnect structures embedded in the first dielectric layer; and
   a second vertical interconnect structure that extends at least partially through a second dielectric layer disposed over the capacitor, and which electrically connects the second plate to a third interconnect structure embedded in a third dielectric layer, the third dielectric layer disposed over the second dielectric layer.

3. The semiconductor device of claim 2, further comprising a second interconnect structure partially embedded in the second dielectric layer, wherein the second interconnect structure, the capacitor, and the resistor are laterally spaced from one another in the second Si-rich dielectric material disposed between the first dielectric layer and the second dielectric layer.

4. The semiconductor device of claim 3, wherein the second interconnect structure, the capacitor, and the resistor are at least partially wrapped by the second Si-rich dielectric material.

5. The semiconductor device of claim 2, further comprising:
   a third vertical interconnect structure that extends at least partially through the first dielectric layer, and which electrically connects a first end of the thin film to a second one of the plurality of interconnect structures embedded in the first dielectric layer; and
   a fourth vertical interconnect structure that extends at least partially through the first dielectric layer, and which electrically connects a second end of the thin film to a third one of the plurality of interconnect structures embedded in the first dielectric layer.

6. The semiconductor device of claim 5, wherein the third vertical interconnect structure and the fourth vertical interconnect structure are in direct contact with the thin film.

7. The semiconductor device of claim 1, wherein the resistor dielectric layer and the capacitor dielectric layer comprise a same dielectric material.

8. The semiconductor device of claim 7, wherein the dielectric material includes an anti-reflective coating (ARC) material.

9. The semiconductor device of claim 1, wherein the conductive material includes at least one material selected from the group consisting of Ta, TaN, Ti, TiN, W, WN, NiCr, and SiCr.

10. A semiconductor device, comprising:
    a first plate disposed over a substrate and comprising a first conductive material;
    a thin film, also disposed over the substrate and comprising the first conductive material, that is substantially coplanar with the first plate, wherein the thin film is overlaid by a resistor dielectric layer;
    a capacitor dielectric layer comprising a dielectric material and disposed over the first plate;

a second plate comprising a second conductive material and disposed over the capacitor dielectric layer;

a first Si-rich dielectric material having a plurality of silicon nanocrystals and disposed below the thin film and the first plate; and a second Si-rich dielectric material having a plurality of silicon nanocrystals and disposed over the thin film and the second plate;

wherein the thin film constitutes at least a portion of a resistor, and the first plate, the capacitor dielectric layer, and the second plate constitute at least a portion of a capacitor;

wherein the first plate and capacitor dielectric layer have a first width, and the second plate has a second width, the first width being greater than the second width; and wherein the thin film and the first plate each have a first thickness, and the resistor dielectric layer and the capacitor dielectric layer each have a second thickness, a ratio of the first thickness to the second thickness being equal to or less than about 0.25.

11. The semiconductor device of claim 10, wherein the dielectric material includes an anti-reflective coating (ARC) material.

12. The semiconductor device of claim 10, wherein the first conductive material includes at least one material selected from the group consisting of Ta, TaN, Ti, TiN, W, WN, NiCr, and SiCr.

13. The semiconductor device of claim 10, further comprising:

a first vertical interconnect structure that extends at least partially through a first dielectric layer disposed below the first plate and the thin film, and which electrically connects the first plate to a first one of the plurality of interconnect structures embedded in the first dielectric layer;

a second vertical interconnect structure that extends at least partially through a second dielectric layer disposed over the capacitor, and which electrically connects the second plate to a third interconnect structure embedded in a third dielectric layer disposed over the second dielectric layer;

a third vertical interconnect structure, at least partially extending through the first dielectric layer, that electrically connects a first end of the thin film to a second one of the plurality of interconnect structures embedded in the first dielectric layer; and a fourth vertical interconnect structure, at least partially extending through the first dielectric layer, that electrically connects a second end of the thin film to a third one of the plurality of interconnect structures embedded in the first dielectric layer.

14. A semiconductor device, comprising:

a resistor disposed over a substrate and essentially consisting of a thin film, wherein the thin film is overlaid by a resistor dielectric layer;

a capacitor disposed over the substrate and comprising:
a first plate;
a capacitor dielectric layer disposed over the first plate; and
a second plate disposed over the capacitor dielectric layer;

a first Si-rich dielectric material having a plurality of silicon nanocrystals and disposed below the thin film and the first plate; and a second Si-rich dielectric material having a plurality of silicon nanocrystals and disposed over the thin film and the second plate;

wherein the thin film of the resistor and the first plate of the capacitor comprise a same conductive material and are coplanar with each other;

wherein the first plate and capacitor dielectric layer have a first width, and the second plate has a second width, the first width being greater than the second width; and wherein the thin film and the first plate each have a first thickness, and the resistor dielectric layer and the capacitor dielectric layer each have a second thickness, a ratio of the first thickness to the second thickness being equal to or less than about 0.25.

15. The semiconductor device of claim 14, wherein the capacitor dielectric layer includes an anti-reflective coating (ARC) material.

16. The semiconductor device of claim 14, wherein the conductive material includes at least one material selected from the group consisting of Ta, TaN, Ti, TiN, W, WN, NiCr, and SiCr.

17. The semiconductor device of claim 14, further comprising:

a first vertical interconnect structure that extends at least partially through a first dielectric layer disposed below the first plate and the thin film, and which electrically connects the first plate to a first one of a plurality of interconnect structures embedded in the first dielectric layer; and a second vertical interconnect structure that extends at least partially through a second dielectric layer disposed over the capacitor, and which electrically connects the second plate to a third interconnect structure embedded in a third dielectric layer, the third dielectric layer disposed over the second dielectric layer.

18. The semiconductor device of claim 17, further comprising a second interconnect structure partially embedded in the second dielectric layer, wherein the second interconnect structure, the capacitor, and the resistor are laterally spaced from one another in the second Si-rich dielectric material disposed between the first dielectric layer and the second dielectric layer.

19. The semiconductor device of claim 14, wherein a ratio of the first width to the second width is in a range of about 1.2 to about 1.8.

20. The semiconductor device of claim 14, further comprising a dielectric segment that includes an anti-reflective coating (ARC) material and is disposed above the thin film, wherein the dielectric segment and the thin film share a same width.

* * * * *